(12) United States Patent
Kirby

(10) Patent No.: US 11,942,428 B2
(45) Date of Patent: Mar. 26, 2024

(54) INDUCTORS WITH THROUGH-SUBSTRATE VIA CORES

(71) Applicant: Micron Technology, Inc., Boise, ID (US)

(72) Inventor: Kyle K. Kirby, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/108,589

(22) Filed: Dec. 1, 2020

(65) Prior Publication Data

US 2021/0082818 A1  Mar. 18, 2021

Related U.S. Application Data

(62) Division of application No. 15/584,294, filed on May 2, 2017, now abandoned.

(51) Int. Cl.
| | | |
|---|---|---|
| *H01L 23/535* | (2006.01) | |
| *H01F 17/00* | (2006.01) | |
| *H01L 23/48* | (2006.01) | |
| *H01L 23/522* | (2006.01) | |
| *H01L 49/02* | (2006.01) | |

(52) U.S. Cl.
CPC ....... *H01L 23/535* (2013.01); *H01F 17/0033* (2013.01); *H01L 23/481* (2013.01); *H01L 23/5227* (2013.01); *H01L 28/00* (2013.01); *H01F 2017/002* (2013.01); *H01F 2017/0086* (2013.01)

(58) Field of Classification Search
CPC . H01L 23/481; H01L 23/5227; H01L 23/535; H01L 28/00; H01F 17/0033; H01F 2017/002; H01F 2017/0086
See application file for complete search history.

(56) References Cited

U.S. PATENT DOCUMENTS

| | | | |
|---|---|---|---|
| 5,095,357 | A | 3/1992 | Andoh et al. |
| 5,852,866 | A | 12/1998 | Kuettner et al. |
| 6,303,971 | B1 | 10/2001 | Rhee |
| 7,404,249 | B2 | 7/2008 | Gardes et al. |

(Continued)

FOREIGN PATENT DOCUMENTS

| | | |
|---|---|---|
| CN | 102341870 A | 2/2012 |
| CN | 106024722 A | 10/2016 |

(Continued)

OTHER PUBLICATIONS

International Application No. PCT/US2018/026239—International Search Report and Written Opinion, dated Jul. 26, 2018, 10 pages.

(Continued)

*Primary Examiner* — Meiya Li
(74) *Attorney, Agent, or Firm* — Perkins Coie LLP

(57) ABSTRACT

A semiconductor device including a substrate is provided. The device further includes a through-substrate via (TSV) extending into the substrate, and a substantially helical conductor disposed around the TSV. The substantially helical conductor can be configured to generate a magnetic field in the TSV in response to a current passing through the helical conductor. More than one TSV can be included, and/or more than one substantially helical conductor can be provided.

19 Claims, 15 Drawing Sheets

(56) References Cited

U.S. PATENT DOCUMENTS

| | | |
|---|---|---|
| 7,486,168 B2 | 2/2009 | Kim |
| 8,492,872 B2 | 7/2013 | Yang et al. |
| 8,791,501 B1 | 7/2014 | Fuentes et al. |
| 9,806,144 B2 | 10/2017 | Kim et al. |
| 10,134,671 B1 | 11/2018 | Kirby |
| 10,157,830 B2 | 12/2018 | Kirby |
| 2004/0246692 A1 | 12/2004 | Satoh et al. |
| 2004/0261252 A1* | 12/2004 | Younger ............... H01F 41/122 29/605 |
| 2007/0205855 A1 | 9/2007 | Hashimoto |
| 2009/0140383 A1 | 6/2009 | Chang et al. |
| 2009/0243035 A1 | 10/2009 | Mashino et al. |
| 2009/0267084 A1 | 10/2009 | Bilger et al. |
| 2009/0283854 A1 | 11/2009 | Levy et al. |
| 2010/0024202 A1 | 2/2010 | Maki et al. |
| 2010/0164671 A1 | 7/2010 | Pagani et al. |
| 2010/0327824 A1 | 12/2010 | Dellacona |
| 2011/0073987 A1 | 3/2011 | Mackh et al. |
| 2011/0084782 A1 | 4/2011 | Kanno |
| 2011/0156488 A1 | 6/2011 | Kuroda |
| 2012/0068301 A1 | 3/2012 | Sin et al. |
| 2012/0162947 A1 | 6/2012 | ODonnell et al. |
| 2012/0187530 A1 | 7/2012 | Zhang et al. |
| 2012/0249282 A1* | 10/2012 | Sin .................. H01L 28/10 336/200 |
| 2012/0256290 A1 | 10/2012 | Renna et al. |
| 2013/0056847 A1 | 3/2013 | Chen |
| 2013/0063234 A1 | 3/2013 | Kamath et al. |
| 2013/0168809 A1 | 7/2013 | Yen et al. |
| 2013/0181534 A1 | 7/2013 | Jin et al. |
| 2013/0187255 A1 | 7/2013 | Wang et al. |
| 2013/0321094 A1 | 12/2013 | Sumida et al. |
| 2014/0061854 A1 | 3/2014 | Chen |
| 2014/0104284 A1 | 4/2014 | Shenoy et al. |
| 2014/0131841 A1 | 5/2014 | Tseng et al. |
| 2014/0159196 A1 | 6/2014 | Mackh et al. |
| 2014/0217546 A1 | 8/2014 | Yen et al. |
| 2014/0225208 A1 | 8/2014 | Gu et al. |
| 2014/0323046 A1 | 10/2014 | Asai et al. |
| 2015/0054710 A1 | 2/2015 | Lee et al. |
| 2015/0115405 A1 | 4/2015 | Wu et al. |
| 2015/0287773 A1 | 10/2015 | Wang et al. |
| 2016/0012958 A1 | 1/2016 | Li et al. |
| 2016/0109399 A1 | 4/2016 | O'Donnell et al. |
| 2016/0148714 A1 | 5/2016 | Yoon |
| 2017/0005046 A1 | 1/2017 | Sin et al. |
| 2017/0178786 A1 | 6/2017 | Lambert et al. |
| 2017/0330930 A1 | 11/2017 | Cook et al. |
| 2017/0338034 A1 | 11/2017 | Yun et al. |
| 2018/0323133 A1 | 11/2018 | Kirby |
| 2018/0323145 A1 | 11/2018 | Kirby |
| 2018/0323146 A1 | 11/2018 | Kirby |
| 2018/0323147 A1 | 11/2018 | Kirby |
| 2018/0323253 A1 | 11/2018 | Kirby |
| 2018/0323369 A1 | 11/2018 | Kirby |
| 2019/0027437 A1 | 1/2019 | Kirby |
| 2021/0104451 A1 | 4/2021 | Kirby |

FOREIGN PATENT DOCUMENTS

| | | |
|---|---|---|
| CN | 106206553 A | 12/2016 |
| CN | 106449550 A | 2/2017 |
| EP | 0725407 A1 | 8/1996 |
| EP | 2966661 A2 | 1/2016 |
| KR | 20110011691 U | 12/2011 |
| WO | 2014045518 A1 | 3/2014 |
| WO | 2014123790 A1 | 8/2014 |
| WO | 2015043419 A1 | 4/2015 |
| WO | 2016094651 A1 | 6/2016 |

OTHER PUBLICATIONS

International Application No. PCT/US2018/026253—International Search Report and Written Opinion, dated Jul. 27, 2018, 13 pages.
International Application No. PCT/US2018/026256—International Search Report and Written Opinion, dated Jul. 4, 2018, 16 pages.
International Application No. PCT/US2018/026263—International Search Report and Written Opinion, dated Jul. 4, 2018, 16 pages.
International Application No. PCT/US2018/026269—International Search Report and Written Opinion, dated Jul. 5, 2018, 14 pages.
TW Patent Application No. 107113941—Taiwanese Office Action, dated Jan. 31, 2019, with English Translation, 12 pages.
TW Patent Application No. 107113942—Taiwanese Office Action and Search Report, dated May 14, 2019, with English Translation, 7 pages.
TW Patent Application No. 107113943—Taiwanese Office Action and Search Report, dated Jul. 29, 2019, with English Translation, 19 pages.
TW Patent Application No. 107113943—Taiwanese Office Action and Search Report, dated Nov. 29, 2018, with English Translation, 11 pages.
TW Patent Application No. 107113943—Taiwanese Office Action, dated Nov. 29, 2019, with English Translation, 12 pages.
TW Patent Application No. 107113945—Taiwanese Office Action and Search Report, dated Apr. 15, 2019, with English Translation, 12 pages.
TW Patent Application No. 107113945—Taiwanese Office Action and Search Report, dated Jul. 30, 2019, with English Translation, 17 pages.
TW Patent Application No. 107113957—Taiwanese Office Action and Search Report, dated Apr. 24, 2019, with English Translation, 11 pages.
TW Patent Application No. 107113957—Taiwanese Office Action and Search Report, dated Jun. 9, 2020, with English Translation, 9 pages.
KR Patent Application No. 10-2019-7035452—Korean Office Action and Search Report, dated Mar. 29, 2022, with English Translation, 17 pages.
KR Patent Application No. 10-2019-7035452—Korean Office Action and Search Report, dated May 21, 2021, with English Translation, 11 pages.
KR Patent Application No. 10-2019-7035452—Korean Office Action and Search Report, dated Nov. 9, 2020, with English Translation, 21 pages.
KR Patent Application No. 10-2019-7035452—Korean Office Action and Search Report, dated Nov. 9, 2020, with English Translation, 19 pages.
Chinese Patent Application No. 201880035169.7—Office Action with English Translation dated Sep. 9, 2022, 14 pages.
Chinese Patent Application No. 201880028957.3—Office Action with English Translation dated Sep. 19, 2022, 21 pages.
Korean Patent Application No. 10-2019-7035452—Notice of Allowance with English translation dated Dec. 14, 2022, 5 pages.
PRC (China) Patent Application No. 201880032682.0—Chinese Office Action with English Translation dated Mar. 28, 2023, 20 pages.

* cited by examiner

INDUCTORS WITH THROUGH-SUBSTRATE VIA CORES

CROSS-REFERENCE TO RELATED APPLICATIONS

This application is a division of U.S. application Ser. No. 15/584,294, filed May 2, 2017; which is incorporated herein by reference in its entirety.

This application contains subject matter related to an U.S. patent application by Kyle K. Kirby, entitled "SEMICONDUCTOR DEVICES WITH BACK-SIDE COILS FOR WIRELESS SIGNAL AND POWER COUPLING." The related application, of which the disclosure is incorporated by reference herein, is assigned to Micron Technology, Inc., and is identified as U.S. patent application Ser. No. 15/584,278, filed May 2, 2017.

This application contains subject matter related to an U.S. patent application by Kyle K. Kirby, entitled "SEMICONDUCTOR DEVICES WITH THROUGH-SUBSTRATE COILS FOR WIRELESS SIGNAL AND POWER COUPLING." The related application, of which the disclosure is incorporated by reference herein, is assigned to Micron Technology, Inc., and is identified as U.S. patent application Ser. No. 15/584,310, filed May 2, 2017.

This application contains subject matter related to an U.S. patent application by Kyle K. Kirby, entitled "MULTI-DIE INDUCTORS WITH COUPLED THROUGH-SUBSTRATE VIA CORES." The related application, of which the disclosure is incorporated by reference herein, is assigned to Micron Technology, Inc., and is identified as U.S. patent application Ser. No. 15/584,881, filed May 2, 2017.

This application contains subject matter related to an U.S. patent application by Kyle K. Kirby, entitled "3D INTERCONNECT MULTI-DIE INDUCTORS WITH THROUGH-SUBSTRATE VIA CORES." The related application, of which the disclosure is incorporated by reference herein, is assigned to Micron Technology, Inc., and is identified as U.S. patent application Ser. No. 15/584,965, filed May 2, 2017.

TECHNICAL FIELD

The present disclosure generally relates to semiconductor devices, and more particularly relates to semiconductor devices including inductors with through-substrate via cores, and methods of making and using the same.

BACKGROUND

As the need for miniaturization of electronic circuits continues to increase, the need to minimize various circuit elements, such as inductors, increases apace. Inductors are an important component in many discrete element circuits, such as impedance-matching circuits, linear filters, and various power circuits. Since traditional inductors are bulky components, successful miniaturization of inductors presents a challenging engineering problem.

One approach to miniaturizing an inductor is to use standard integrated circuit building blocks, such as resistors, capacitors, and active circuitry, such as operational amplifiers, to design an active inductor that simulates the electrical properties of a discrete inductor. Active inductors can be designed to have a high inductance and a high Q factor, but inductors fabricated using these designs consume a great deal of power and generate noise. Another approach is to fabricate a spiral-type inductor using conventional integrated circuit processes. Unfortunately, spiral inductors in a single level (e.g., plane) occupy a large surface area, such that the fabrication of a spiral inductor with high inductance can be cost- and size-prohibitive. Accordingly, there is a need for other approaches to the miniaturization of inductive elements in semiconductor devices.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, semiconductor devices are continually designed with ever greater needs for inductors with high inductance that occupy a small area. Accordingly, several embodiments of semiconductor devices in accordance with the present technology can provide inductors with through-substrate via cores, which can provide high inductance while consuming only a small area.

Several embodiments of the present technology are directed to semiconductor devices, systems including semiconductor devices, and methods of making and operating semiconductor devices. In one embodiment, a semiconductor device comprises a substrate (e.g., of silicon, glass, gallium arsenide, organic material, etc.), a through-substrate via (TSV) extending into the silicon substrate, and a substantially helical conductor disposed around the TSV. The substantially helical conductor can be a non-planar spiral configured to generate a magnetic field in the TSV in response to a current passing through the substantially helical conductor. More than one TSV can be included (e.g., to provide a closed core), and/or more than one substantially helical conductor can be provided (e.g., to provide coupled inductors).

Figure 1:
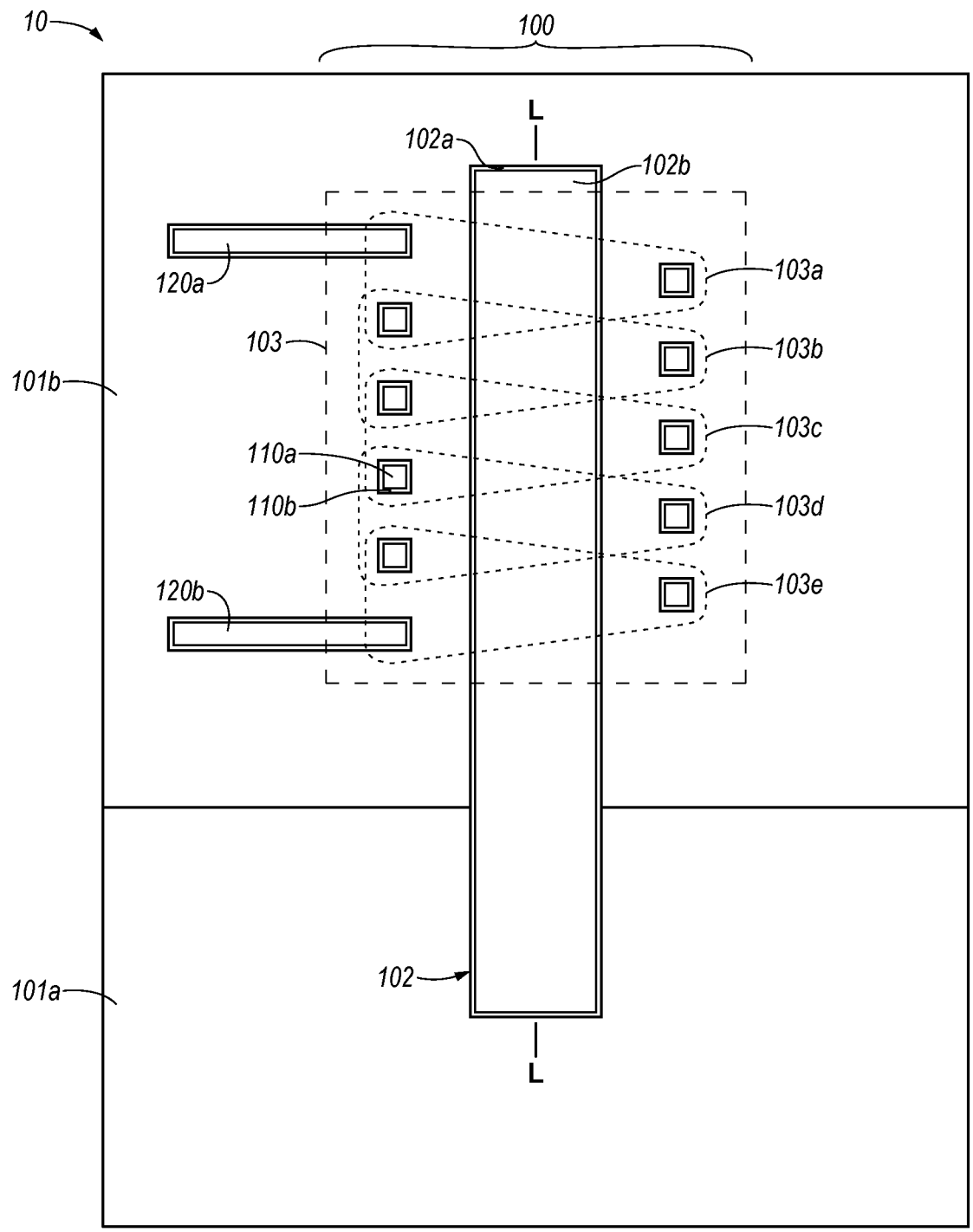
FIG. 1 is a simplified cross-sectional view of a semiconductor device having an inductor with a TSV core configured in accordance with an embodiment of the present technology.

FIG. 1 is a simplified cross-sectional view of a semiconductor device 10 having an inductor 100 with a TSV core configured in accordance with an embodiment of the present technology. The device 10 has a substrate material 101a and an insulating material 101b, and the inductor 100 has one portion in the substrate material 101a and another portion in the insulating material 101b. For example, the inductor 100 can include a TSV 102 having a first portion in the substrate material 101a and a second portion in the insulating material 101b. The TSV 102 accordingly extends out of the substrate material 101a and into the insulating material 101b. The inductor 100 can further include a substantially helical conductor 103 ("conductor 103") around at least a section of the second portion of the TSV 102 in the insulating material 101b. In the embodiment shown in FIG. 1, the conductor 103 is illustrated schematically with five complete turns (103a, 103b, 103c, 103d and 103e) around the TSV 102. The conductor 103 is configured to induce a magnetic field in the TSV 102 in response to a current passing through the conductor 103. The conductor 103 can be operably connected to other circuit elements (not shown) by leads 120a and 120b.

According to one embodiment of the present technology, the substrate material 101a can be any one of a number of substrate materials suitable for semiconductor processing methods, including silicon, glass, gallium arsenide, gallium nitride, organic laminates, molding compounds (e.g., for reconstituted wafers for fan-out wafer-level processing) and the like. As will be readily understood by those skilled in the art, a through-substrate via, such as the TSV 102, can be made by etching a high-aspect-ratio hole into the substrate material 101a and filling it with one or more materials in one or more deposition and/or plating steps. Accordingly, the TSV 102 extends at least substantially into the substrate material 101a, which is unlike other circuit elements that are additively constructed on top of the substrate material 101a. For example, the substrate material 101a can be a silicon wafer of about 800 µm thickness, and the TSV 102 can extend from 30 to 100 µm into the substrate material 101a. In other embodiments, a TSV may extend even further into a substrate material (e.g., 150 µm, 200 µm, etc.), or may extend into a substrate material by as little as 10 µm.

The TSV 102 can also include an outer layer 102a and a magnetic material 102b within the outer layer 102a. The outer layer 102a can be a dielectric or insulating material (e.g., silicon oxide, silicon nitride, polyimide, etc.) that electrically isolates the magnetic material 102b from the conductor 103. In accordance with one embodiment of the present technology, the magnetic material 102b of the TSV 102 can be a material with a higher magnetic permeability than the substrate material 101a and/or the insulating material 101b to increase the magnetic field in the TSV 102 when current flows through the conductor 103. The magnetic material 102b can be, for example, ferromagnetic, ferrimagnetic, or a combination thereof. For example, the TSV 102 can include nickel, iron, cobalt, niobium, or an alloy thereof. The TSV 102 can include more than one material, either in a bulk material of a single composition, or in discrete regions of different materials (e.g., coaxial laminate layers). The TSV 102 can include a bulk material with desirable magnetic properties (e.g., elevated magnetic permeability provided by nickel, iron, cobalt, niobium, or an alloy thereof), or can include multiple discrete layers, only some of which are magnetic, in accordance with an embodiment of the present technology.

For example, following a high-aspect ratio etch and a deposition of an insulator (e.g., insulator 102a), the TSV 102 can be provided in a single metallization step by filling in the insulated opening with a magnetic material. In another embodiment, the TSV 102 can be formed in multiple steps to provide coaxial layers (e.g., two or more magnetic layers separated by one or more non-magnetic layers). For example, multiple conformal plating operations can be performed before a bottom-up fill operation to provide a TSV with a coaxial layer of non-magnetic material separating a core of magnetic material and an outer coaxial layer of magnetic material. In this regard, a first conformal plating step can partially fill and narrow the etched opening with a magnetic material (e.g., nickel, iron, cobalt, niobium, or an alloy thereof), a second conformal plating step can further partially fill and further narrow the opening with a non-magnetic material (e.g., polyimide or the like), and a subsequent bottom-up plating step (e.g., following the deposition of a seed material at the bottom of the narrowed opening) can completely fill the narrowed opening with another magnetic material (e.g., nickel, iron, cobalt, niobium, or an alloy thereof). Such a structure with laminated coaxial layers of magnetic and non-magnetic material can help to reduce eddy current losses in a TSV through which a magnetic flux is passing.

The turns 103a-103e of the conductor 103 are electrically insulated from one another and from the TSV 102. In one embodiment, the insulating material 101b electrically isolates the conductor 103 from the TSV 102. In another embodiment, the conductor 103 can have a conductive inner region 110a covered (e.g., coated) by a dielectric or insulating outer layer 110b. For example, the outer layer 110b of the conductor 103 can be an oxide layer, and the inner region 110a can be copper, gold, tungsten, or alloys thereof. One aspect of the conductor 103 is that the individual turns 103a-103e define a non-planar spiral with respect to the longitudinal dimension "L" of the TSV 102. Each subsequent turn 103a-103e is at a different elevation along the longitudinal dimension L of the TSV 102 in the non-planar spiral of the conductor 103.

A conductive winding (e.g., the conductor 103) of an inductor disposed around a TSV magnetic core (e.g., the TSV 102) need not be smoothly helical, in accordance with one embodiment of the present technology. Although the conductor 103 is illustrated schematically and functionally in FIG. 1 as having turns that, in cross section, appear to gradually increase in distance from a surface of the substrate, it will be readily understood by those skilled in the art that fabricating a smooth helix with an axis perpendicular to a surface of a substrate presents a significant engineering challenge. Accordingly, a "substantially helical" conductor, as used herein, describes a conductor having turns that are separated along the longitudinal dimension L of the TSV (e.g., the z-dimension perpendicular to the substrate surface), but which are not necessarily smoothly varying in the z-dimension (e.g., the substantially helical shape does not possess arcuate, curved surfaces and a constant pitch angle). Rather, an individual turn of the conductor can have a pitch of zero degrees and the adjacent turns can be electrically coupled to each other by steeply-angled or even vertical connectors (e.g., traces or vias) with a larger pitch, such that a "substantially helical" conductor can have a stepped structure. Moreover, the planar shape traced out by the path of individual turns of a substantially helical conductor need not be elliptical or circular. For the convenience of integration with efficient semiconductor processing methodologies (e.g., masking with cost-effective reticles), individual turns of a substantially helical conductor can trace out a polygonal path in a planar view (e.g., a square, a hexagon, an octagon, or some other regular or irregular polygonal shape around the TSV 102). Accordingly, a "substantially helical" conductor, as used herein, describes a non-planar spiral conductor having turns that trace out any shape in a planar view (e.g., parallel to the plane of the substrate surface) surrounding a central axis, including circles, ellipses, regular polygons, irregular polygons, or some combination thereof.

Figure 2:
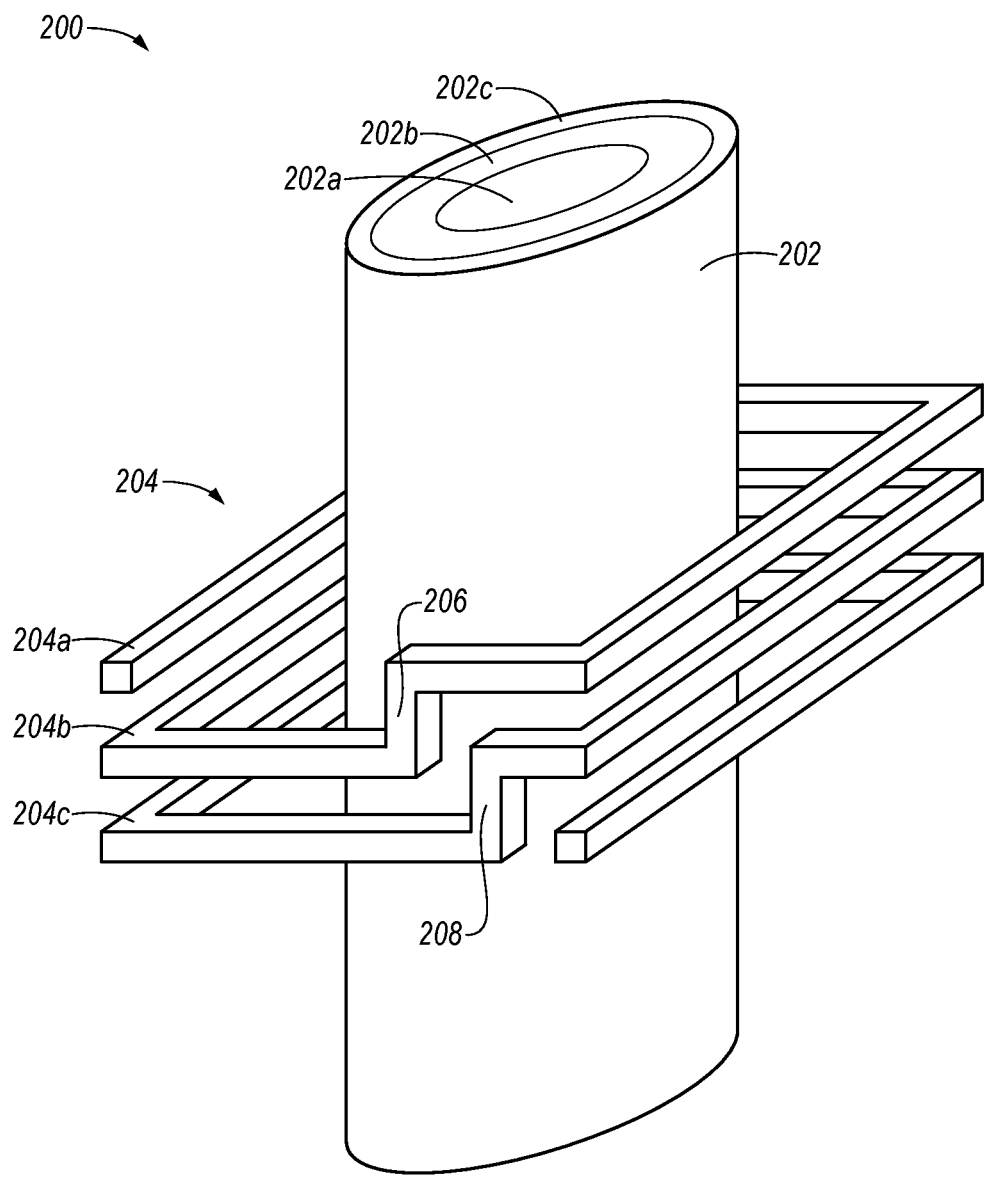
FIG. 2 is a simplified perspective view of a substantially helical conductor disposed around a through-substrate via configured in accordance with an embodiment of the present technology.

FIG. 2 is a simplified perspective view of a substantially helical conductor 204 ("conductor 204") disposed around a through-substrate via 202 configured in accordance with an embodiment of the present technology. For more easily illustrating the substantially helical shape of the conductor 204 illustrated in FIG. 2, the substrate material, insulating materials, and other details of the device in which the conductor 204 and the TSV 202 are disposed have been eliminated from the illustration. As can be seen with reference to FIG. 2, the conductor 204 is disposed coaxially around the TSV 202. The conductor 204 makes three turns (204a, 204b, and 204c) about the TSV 202. As described above, rather than having a single pitch angle, the conductor 204 has a stepped structure, whereby turns with a pitch angle of 0 (e.g., turns laying in a plane of the device 200) are connected by vertical connecting portions that are staggered circumferentially around the turns. In this regard, planar turns 204a and 204b are connected by a vertical connecting portion 206, and planar turns 204b and 204c are connected by a vertical connecting portion 208. This stepped structure facilitates fabrication of the conductor 204 using simpler semiconductor processing techniques (e.g., planar metallization steps for the turns and via formation for the vertical connecting portions). Moreover, as shown in FIG. 2, the turns 204a, 204b, and 204c of the conductor 204 trace a rectangular shape around the TSV 202 when oriented in a planar view.

In accordance with one embodiment, the TSV 202 can optionally (e.g., as shown with dotted lines) include a core material 202a surrounded by one or more coaxial layers, such as layers 202b and 202c. For example, the core 202a and the outer coaxial layer 202c can include magnetic materials, while the middle coaxial layer 202b can include a non-magnetic material, to provide a laminate structure that can reduce eddy current losses. Although the TSV 202 is illustrated in FIG. 2 as optionally including a three-layer structure (e.g., a core 202a surrounded by two coaxially laminated layers 202b and 202c), in other embodiments any number of coaxial laminate layers can be used to fabricate a TSV.

As shown in the foregoing examples of FIG. 1 and FIG. 2, the number of turns made by a substantially helical conductor about a TSV can vary in accordance with different embodiments of the technology. Providing more turns can increase the inductance of an inductor compared to having fewer turns, but at an increase in the cost and complexity of fabrication (e.g., more fabrication steps). The number of turns can be as low as one, or as high as is desired. As is shown in the example embodiment of FIG. 2, a substantially helical conductor need not make an integer number of turns about a TSV (e.g., the top and/or bottom turn may not be a complete turn).

Figure 3:
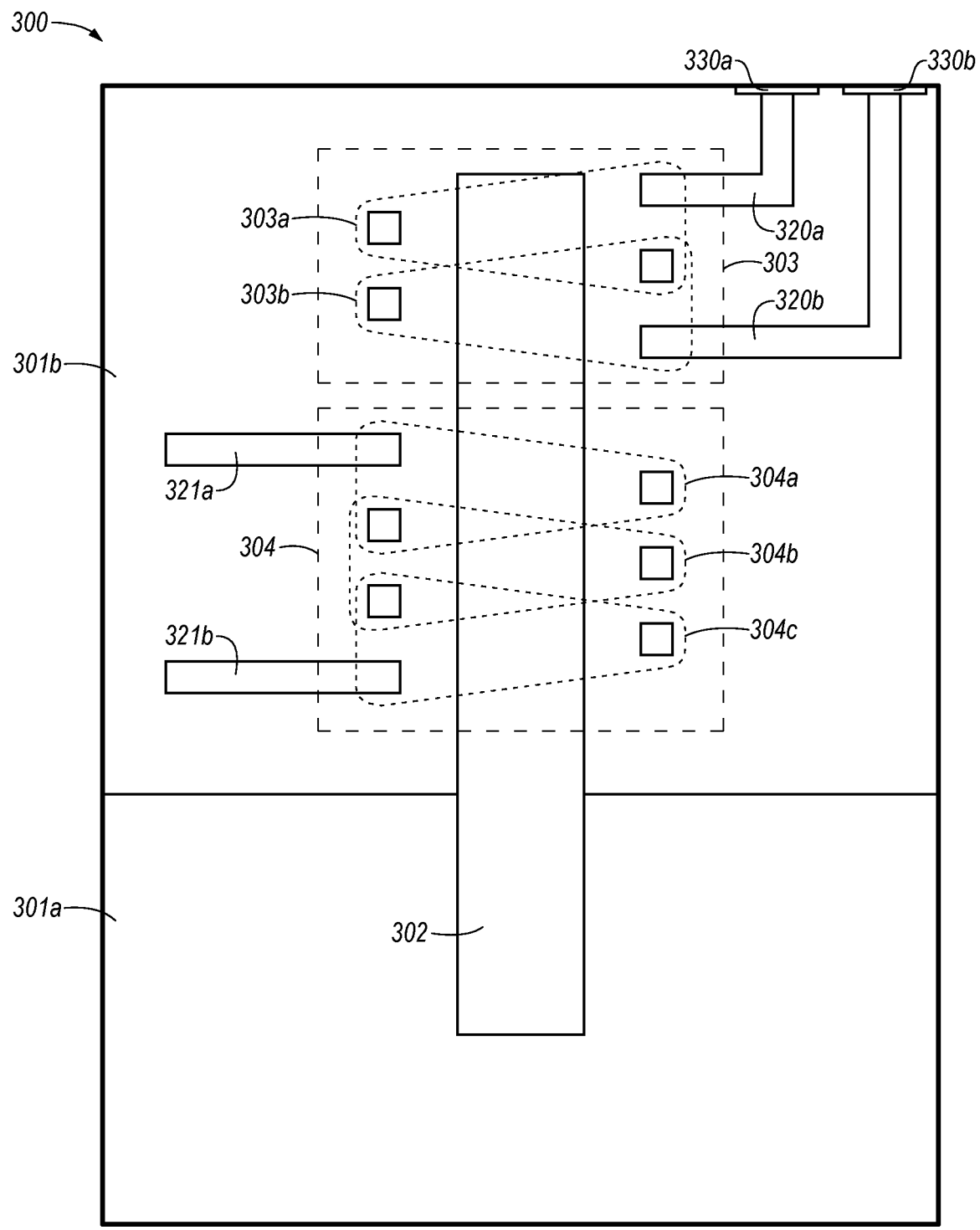
FIG. 3 is a simplified cross-sectional view of coupled inductors sharing a through-substrate via core configured in accordance with an embodiment of the present technology.

Although the foregoing embodiments shown in FIGS. 1 and 2 have illustrated a single inductor with a single substantially helical conductor disposed around a single TSV, other embodiments of the present technology can be configured with more than one substantially helical conductor and/or TSV. For example, FIG. 3 is a simplified cross-sectional view of two coupled inductors sharing a common through-substrate via core, configured in accordance with an embodiment of the present technology. As can be seen with reference to FIG. 3, a device 300 includes a substrate material 301a, an insulating material 301b, and a TSV 302. The TSV 302 extends out of the substrate material 301a and into the insulating material 301b. The device 300 also includes a first substantially helical conductor 303 ("conductor 303") disposed around a first portion of the TSV 302 and a second substantially helical conductor 304 ("conductor 304") disposed around a second portion of the TSV 302. In the illustrated embodiment, the first conductor 303 has two complete turns (303a and 303b) around the TSV 302, and the second conductor 304 has three complete turns (304a, 304b, and 304c) around the TSV 302. The first conductor 303 is operably connected to device pads 330a and 330b by leads 320a and 320b, respectively. The second conductor 304 can be operably connected by leads 321a and 321b to other circuit elements (not shown), including one or more rectifiers to revert a coupled alternating current to DC and one or more capacitors or other filter elements to provide steady current.

According to one embodiment, the first conductor 303 is configured to induce a magnetic field in the TSV 302 in response to a current passing through the conductor 303 (e.g., provided by a voltage applied across the pads 330a and 330b). By changing the current passing through the first conductor 303 (e.g., by applying an alternating current, or by repeatedly switching between high and low voltage states), a changing magnetic field can be induced in the TSV 302, which in turn induces a changing current in the second conductor 304. In this fashion, signals and/or power can be coupled between a circuit comprising the first conductor 303 and another comprising the second conductor 304 (e.g., operating the device 300 as a power transformer).

As is shown in FIG. 3, the first conductor 303 and the second conductor 304 have different numbers of turns. As will be readily understood by one skilled in the art, this arrangement allows the device 300 to be operated as a step-up or step-down transformer (depending upon which substantially helical conductor is utilized as the primary winding and which the secondary winding). For example, the application of a first changing current (e.g., 2V of alternating current) to the first conductor 303 will induce a second changing current with a higher voltage (e.g., 3V of alternating current) in the second conductor 304, given the 2:3 ratio of turns between the primary and secondary windings in this configuration. When operated as a step-down transformer (e.g., by utilizing the second conductor 304 as the primary winding, and the first conductor 303 as the secondary winding), the application of a first changing current (e.g., 3V of alternating current) to the second conductor 304 will induce a changing current with a lower voltage (e.g., 2V of alternating current) in the first conductor 303, given the 3:2 ratio of turns between the primary and secondary windings in this configuration.

Although FIG. 3 illustrates two substantially helical conductors or windings disposed around a TSV at two different heights (e.g., coaxially but not concentrically), in other embodiments, multiple substantially helical conductors with different diameters can be provided at the same height (e.g., with radially-spaced conductive turns in the same layers). As the inductance of a substantially helical conductor depends, at least in part, on its diameter and radial spacing from the TSV around which it is disposed, such an approach can be used where a reduction in the number of layer processing steps is more desirable than an increase in the inductance of the substantially helical conductor so radially spaced.

Figure 4:
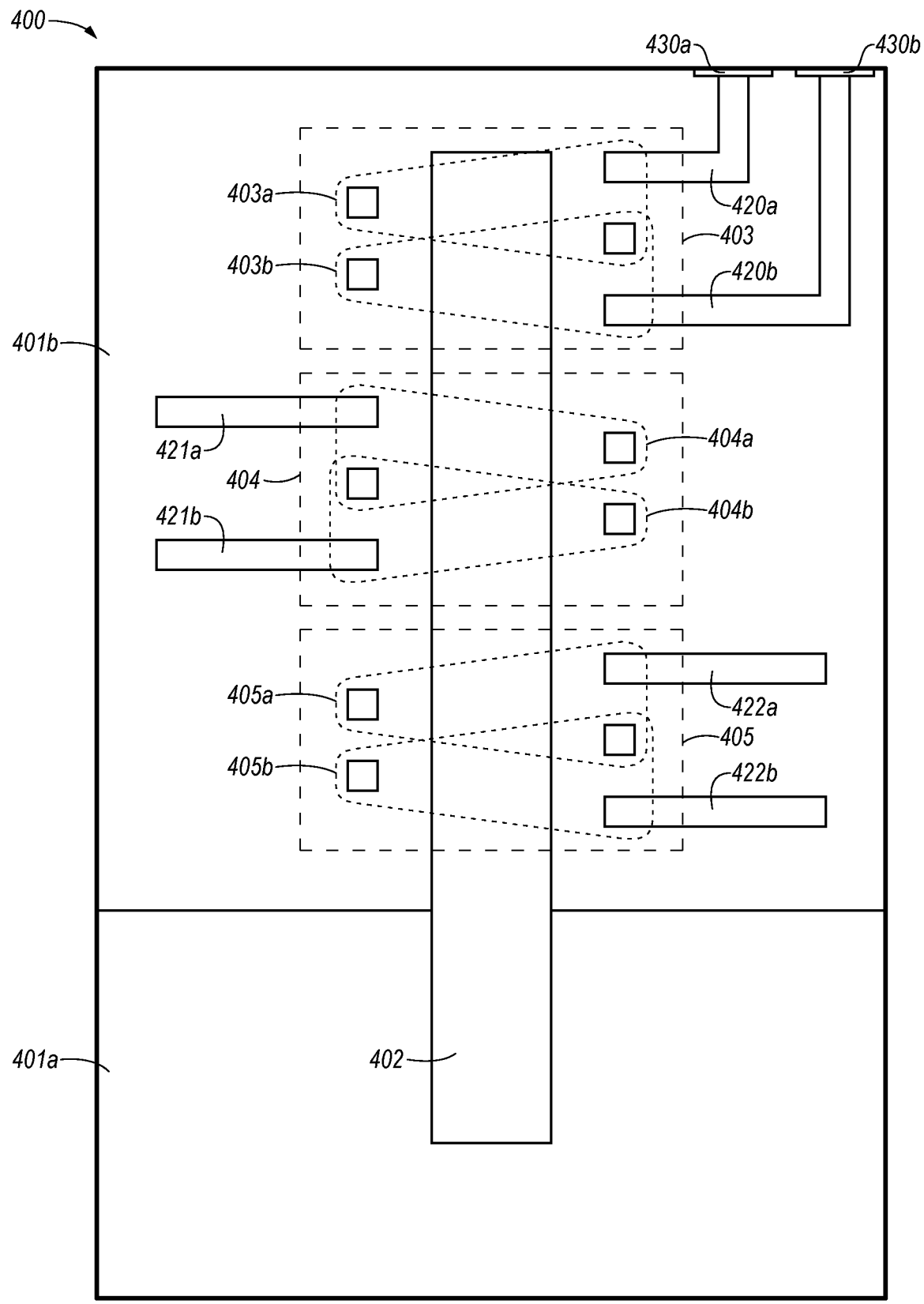
FIG. 4 is a simplified cross-sectional view of coupled inductors sharing a through-substrate via core configured in accordance with an embodiment of the present technology.

Although in the example of FIG. 3 a pair of coupled inductors are shown with different numbers of turns in their windings, in other embodiments of the present technology coupled inductors can be provided with the same number of windings (e.g., to couple two electrically isolated circuits without stepping up or down the voltage from the primary winding). For example, FIG. 4 is a simplified cross-sectional view of coupled inductors sharing a through-substrate via core configured in accordance with an embodiment of the present technology. As can be seen with reference to FIG. 4, a device 400 includes a substrate material 401a, an insulating material 401b, and a TSV 402. The TSV 402 extends out of the substrate material 401a and into the insulating material 401b. The device 400 also includes a first substantially helical conductor 403 ("conductor 403") disposed around a first portion of the TSV 402, a second substantially helical conductor 404 ("conductor 404") disposed around a second portion of the TSV 402, and a third substantially helical conductor 405 ("conductor 405") disposed around a third portion of the TSV 402. In the present embodiment, each of the conductors 403, 404 and 405 is shown to include two complete turns (403a and 403b, 404a and 404b, and 405a and 405b, respectively) around the TSV 402. The first conductor 403 is operably connected to device pads 430a and 430b by leads 420a and 420b, respectively. The second conductor 404 can be operably connected to other circuit elements (not shown) by leads 421a and 421b, as can the third conductor 405 by corresponding leads 422a and 422b.

According to one embodiment, the first conductor 403 is configured to induce a magnetic field in the TSV 402 in response to a current passing through the first conductor 403 (e.g., provided by a voltage differential applied across pads 430a and 430b). By changing the current passing through the first conductor 403 (e.g., by applying an alternating current, or by repeatedly switching between high and low voltage states), a changing magnetic field can be induced in the TSV 402, which in turn induces a changing current in both the second conductor 404 and the third conductor 405. In this fashion, signals and/or power can be coupled between a circuit comprising the first conductor 403 and others comprising the second and third conductors 404 and 405.

Figure 5:
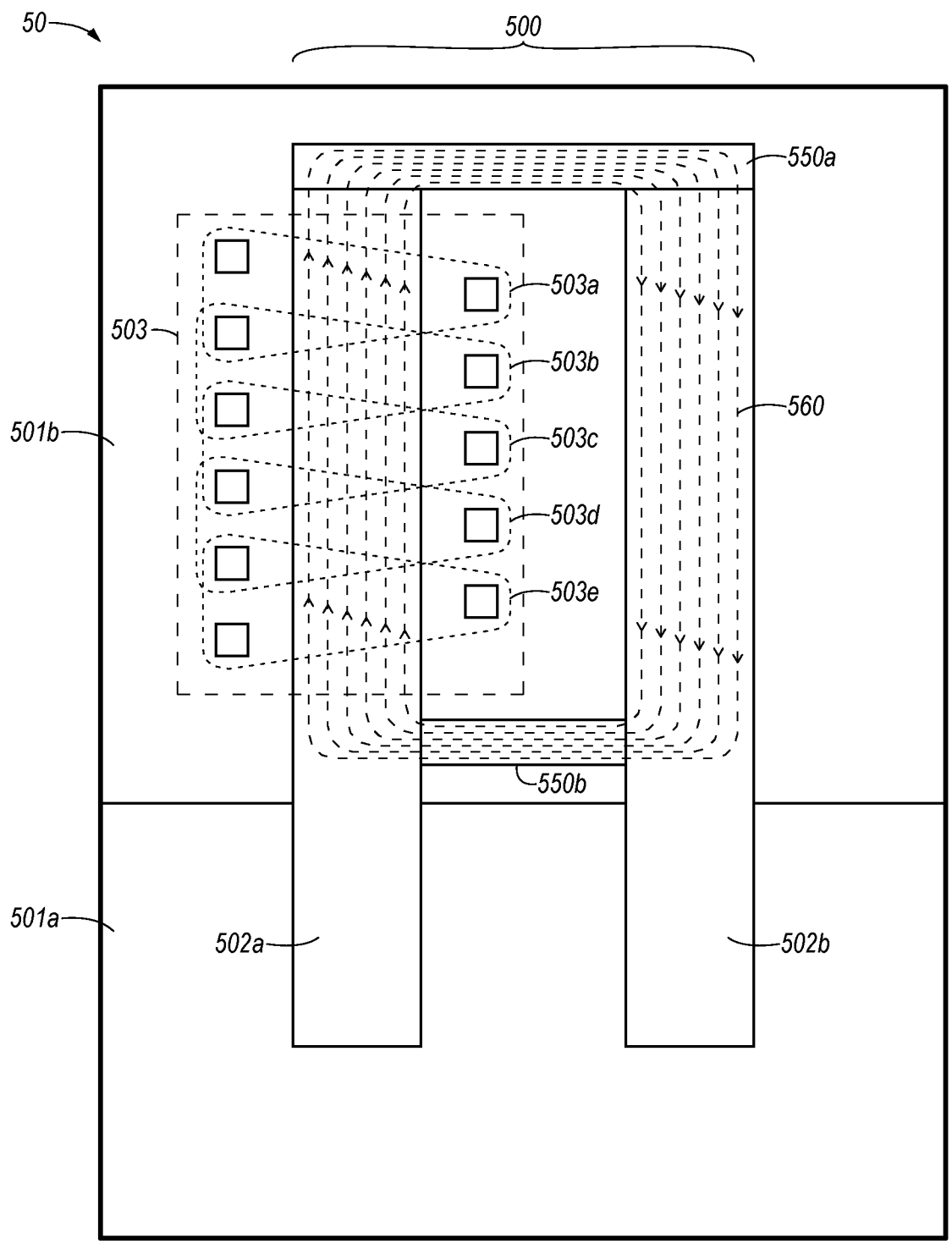
FIG. 5 is a simplified cross-sectional view of a semiconductor device having an inductor with a closed core comprising multiple through-substrate vias configured in accordance with an embodiment of the present technology.

The foregoing example embodiments illustrated in FIGS. 1 through 4 include inductors having an open core (e.g., a core wherein the magnetic field passes through a higher magnetic permeability material for only part of the path of the magnetic field), but embodiments of the present technology can also be provided with a closed core (e.g., a core in which a substantially continuous path of high magnetic permeability material passes through the middle of a conductive winding). For example, FIG. 5 is a simplified cross-sectional view of a semiconductor device 50 having an inductor 500 with a closed core comprising multiple through-substrate vias configured in accordance with an embodiment of the present technology. As can be seen with reference to FIG. 5, the device 50 includes a substrate material 501a and an insulating material 501b, and the inductor 500 has one portion in the substrate material 501a and another portion in the insulating material 501b. For example, the inductor 500 can include a first TSV 502a and a second TSV 502b, each having a first portion in the substrate material 501a and a second portion in the insulating material 501b. The TSVs 502a and 502b accordingly extend out of the substrate material 501a and into the insulating material 501b. The inductor can further include a substantially helical conductor 503 ("conductor 503") around at least a section of the second portion of the TSV 502a in the insulating material 501b. In the embodiment shown in FIG. 5, the conductor 503 has five turns (503a, 503b, 503c, 503d, and 503e) around the TSV 502a. The TSVs 502a and 502b are coupled above the conductor 503 by an upper coupling member 550a, and are coupled below the conductor 503 by a lower coupling member 550b.

The upper coupling member 550a and the lower coupling member 550b can include a magnetic material having a magnetic permeability higher than that of the substrate material 501a and/or the insulating material 501b. The magnetic material of the upper and lower coupling members 550a and 550b can be either the same material as the TSVs 502a and 502b, or a different material. The magnetic material of the upper and lower coupling members 550a and 550b can be a bulk material (e.g., nickel, iron, cobalt, niobium, or an alloy thereof), or a laminated material with differing layers (e.g., of magnetic material and non-magnetic material). Laminated layers of magnetic and non-magnetic material can help to reduce eddy current losses in the upper and lower coupling members 550a and 550b. In accordance with one aspect of the present technology, the first TSV 502a, the second TSV 502b, the upper coupling member 550a and the lower coupling member 550b can together provide a closed path for the magnetic field induced by the conductor 503 (illustrated with magnetic field lines, such as magnetic field line 560), such that the inductance of the inductor 500 is greater than it would be if only the first TSV 502a were provided.

Although in the example embodiment illustrated in FIG. 5 an inductor with a completely closed core is illustrated, in other embodiments one or both of the upper and lower coupling members could be omitted. In such an embodiment, a second TSV with elevated magnetic permeability could be situated near a first TSV around which a winding is disposed to provide an open core embodiment with improved inductance over the single-TSV embodiments illustrated in FIGS. 1 through 4.

Figure 6:
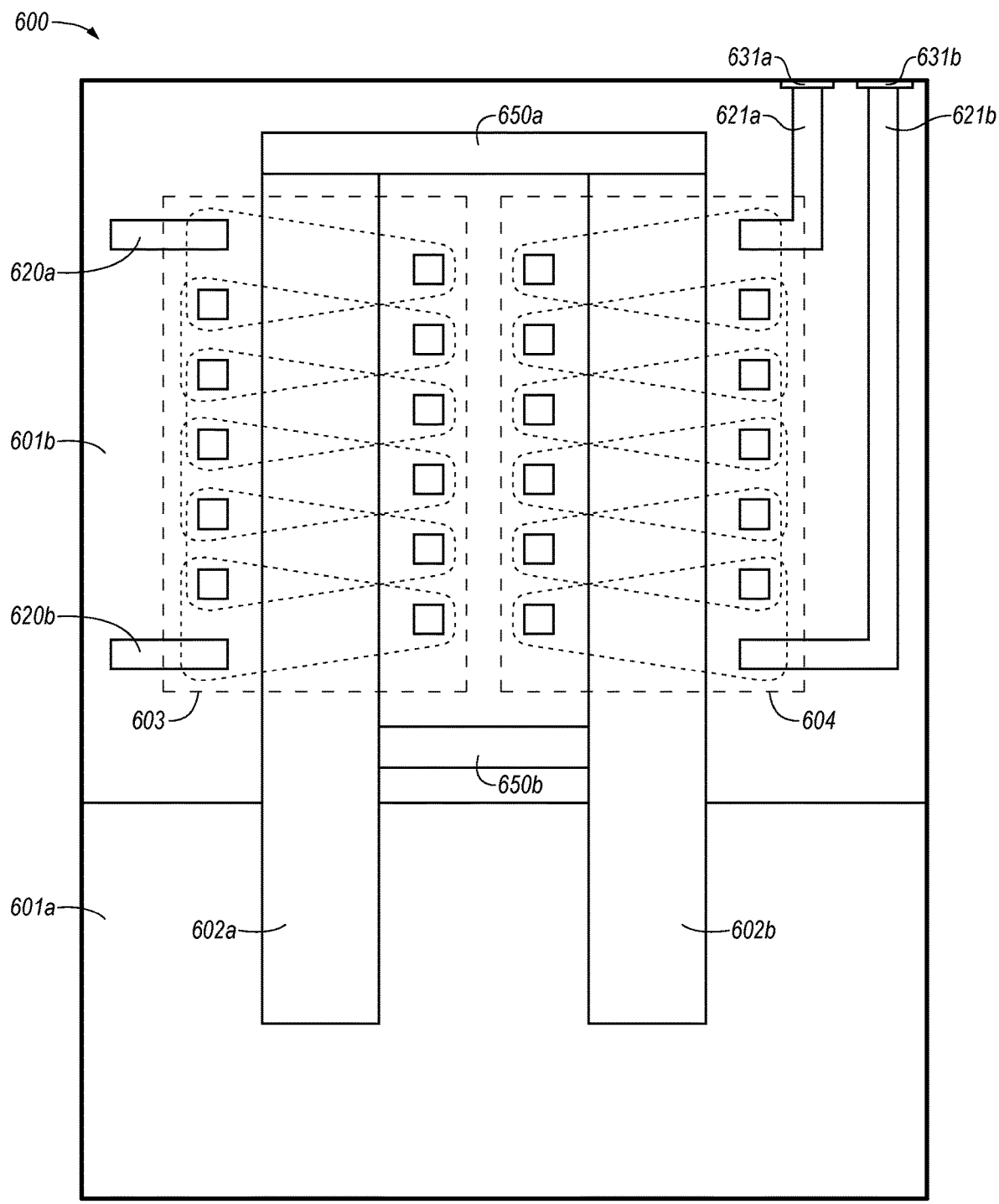
FIG. 6 is a simplified cross-sectional view of coupled inductors with through-substrate via cores configured in accordance with an embodiment of the present technology.

According to one embodiment, a closed magnetic core as illustrated by way of example in FIG. 5 can provide additional space in which one or more additional windings can be disposed (e.g., to provide a transformer or power couple). For example, FIG. 6 is a simplified cross-sectional view of coupled inductors with through-substrate via cores configured in accordance with an embodiment of the present technology. As can be seen with reference to FIG. 6, a device 600 includes a substrate material 601a, an insulating material 601b, and two TSVs 602a and 602b. The TSVs 602a and 602b extend out of the substrate material 601a and into the insulating material 601b. The device 600 also includes a first substantially helical conductor 603 ("conductor 603") with six turns disposed around the first TSV 602a, and a second substantially helical conductor 604 ("conductor 604"), also with six turns, disposed around the second TSV 602b. The first conductor 603 is connected to other circuit elements (not shown) by leads 620a and 620b. The second conductor 604 is connected to pads 631a and 631b on a top surface of the device 600 by leads 621a and 621b, respectively. The TSVs 602a and 602b are coupled (a) above the first and second conductors 603 and 604 by an upper coupling member 650a, and (b) below the first and second conductors 603 and 604 by a lower coupling member 650b.

According to one embodiment, the first conductor 603 is configured to induce a magnetic field in the first and second TSVs 602a and 602b (as well as in the upper and lower coupling members 650a and 650b) in response to a current passing through the first conductor 603 (e.g., provided by a voltage applied across leads 620a and 620b). By changing the current passing through the first conductor 603 (e.g., by applying an alternating current, or by repeatedly switching between high and low voltage states), a changing magnetic field can be induced in the first and second TSVs 602a and 602b (as well as in the upper and lower coupling members 650a and 650b), which in turn induces a changing current in the second conductor 604. In this fashion, signals and/or power can be coupled between a circuit comprising the first conductor 603 (e.g., in a device electrically coupled to leads 620a and 620b) and another circuit comprising the second conductor 604 (e.g., in a device in another die electrically coupled via the pads 631a and 631b).

Figure 7:
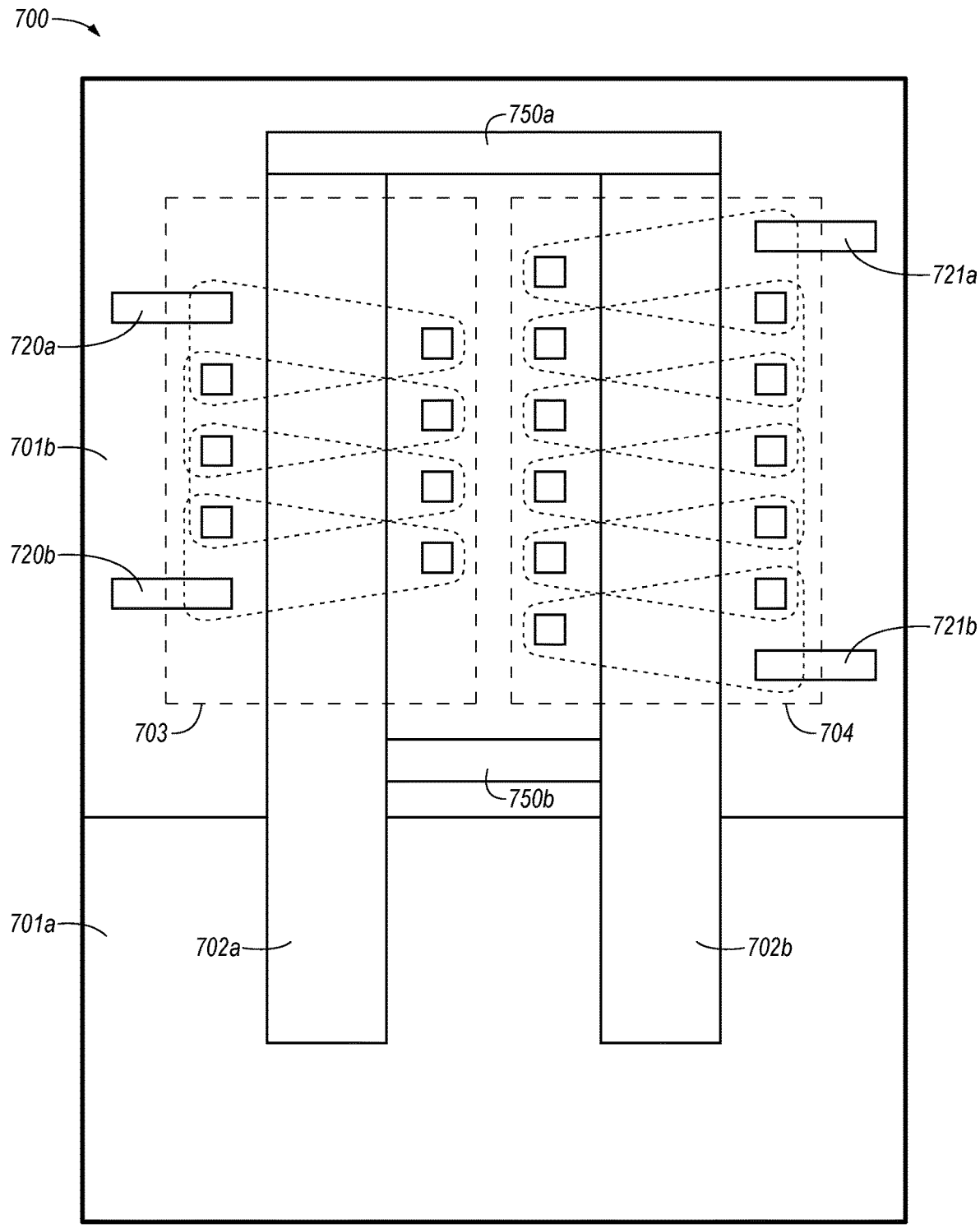
FIG. 7 is a simplified cross-sectional view of coupled inductors with through-substrate via cores configured in accordance with an embodiment of the present technology.

Although in the embodiment illustrated in FIG. 6 two coupled inductors on proximate TSVs are shown with the same number of turns, in other embodiments of the present technology different numbers of windings can be provided on similarly-configured inductors. For example, FIG. 7 is a simplified cross-sectional view of coupled inductors with through-substrate via cores configured in accordance with an embodiment of the present technology. As can be seen with reference to FIG. 7, the device 700 includes a substrate material 701a, an insulating material 701b, and two TSVs 702a and 702b. The TSVs 702a and 702b extend out of the substrate material 701a and into the insulating material 701b. The device 700 also includes a first substantially helical conductor 703 ("conductor 703") with four turns disposed around the first TSV 702a, and a second substantially helical conductor 704 ("conductor 704") with six turns disposed around the second TSV 702b. The first conductor 703 can be operably connected to other circuit elements (not shown) by leads 720a and 720b. The second conductor 704 can be operably connected to other circuit elements (not shown) by leads 721a and 721b. The first and second TSVs 702a and 702b are coupled above the first and second conductors 703 and 704 by an upper coupling member 750a, and are coupled below the first and second conductors 703 and 704 by a lower coupling member 750b.

According to one embodiment, the first conductor 703 is configured to induce a magnetic field in the first and second TSVs 702a and 702b (as well as in the upper and lower coupling members 750a and 750b) in response to a current passing through the first conductor 703. By changing the current passing through the first conductor 703 (e.g., by applying an alternating current, or by repeatedly switching between high and low voltage states), a changing magnetic field can be induced in the first and second TSVs 702a and 702b (as well as in the upper and lower coupling members 750a and 750b, as shown above with reference to FIG. 5), which in turn induces a changing current in the second conductor 704. In this fashion, signals and/or power can be coupled between a circuit comprising the first conductor 703 (e.g., in a device electrically coupled via leads 720a and 720b) and another circuit comprising the second conductor 704 (e.g., in a device electrically coupled via leads 721a and 721b).

The first conductor 703 and the second conductor 704 shown in FIG. 7 have different numbers of turns. As will be readily understood by one skilled in the art, this arrangement allows the device 700 to be operated as a step-up or step-down transformer (depending upon which conductor is utilized as the primary winding and which the secondary winding). For example, the application of a first changing current (e.g., 3V of alternating current) to the second conductor 704 will induce a second changing current with lower voltage (e.g., 2V of alternating current) in the first conductor 703, given the 6:4 ratio of turns between the primary and secondary windings in this configuration.

Figure 8:
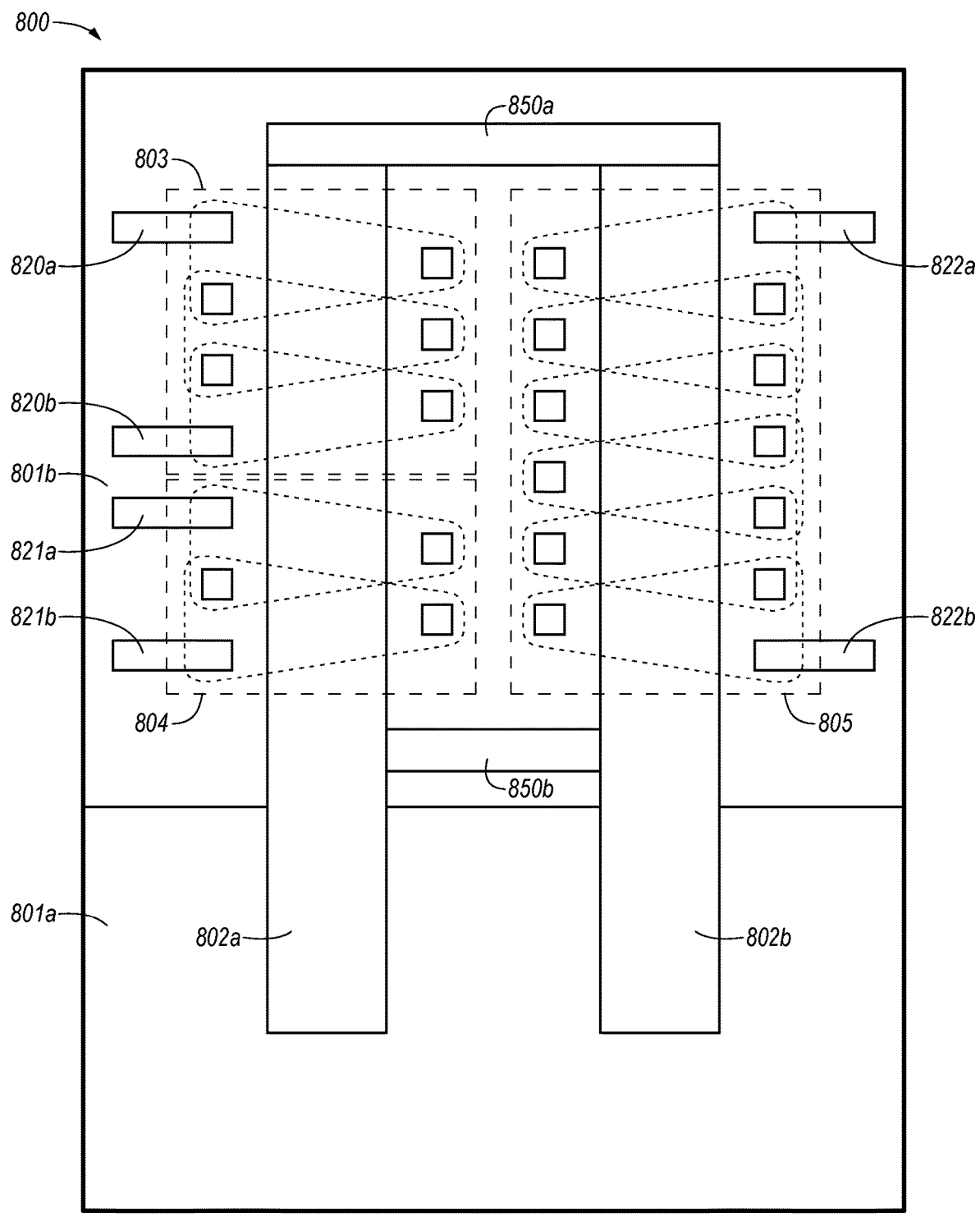
FIG. 8 is a simplified cross-sectional view of coupled inductors with through-substrate via cores configured in accordance with an embodiment of the present technology.

Although in the embodiments illustrated in FIGS. 6 and 7 devices with an equal number of TSVs and windings are illustrated, other embodiments of the present technology can provide more than one winding on either or both of a pair of proximate or coupled TSVs. For example, FIG. 8 is a simplified cross-sectional view of coupled inductors with through-substrate via cores configured in accordance with an embodiment of the present technology. As can be seen with reference to FIG. 8, the device 800 includes a substrate material 801a, an insulating material 801b, and two TSVs 802a and 802b. The TSVs 802a and 802b extend out of the substrate material 801a and into the insulating material 801b. The device 800 also includes a first substantially helical conductor 803 ("conductor 803") with three turns around a first portion of the first TSV 802a, and a second substantially helical conductor 804 ("conductor 804") with two turns around a second portion of the first TSV 802a. The device further includes a third substantially helical conductor 805 ("conductor 805") with six turns around the second TSV 802b. The first conductor 803 can be operably connected to other circuit elements (not shown) by leads 820a and 820b, the second conductor 804 can be operably connected to other circuit elements (not shown) by leads 821a and 821b, and the third conductor 805 can be operably connected to other circuit elements (not shown) by leads 822a and 822b. The first and second TSVs 802a and 802b are coupled (a) above the three conductors 803, 804 and 805 by an upper coupling member 850a, and (b) below the three conductors 803, 804 and 805 by a lower coupling member 850b.

According to one embodiment, the first conductor 803 is configured to induce a magnetic field in the first and second TSVs 802a and 802b (as well as in the upper and lower coupling members 850a and 850b) in response to a current passing through the first conductor. By changing the current passing through the first conductor 803 (e.g., by applying an alternating current, or by repeatedly switching between high and low voltage states), a changing magnetic field can be induced in the first TSV 802a and the second TSV 802b (as well as in the upper and lower coupling members 850a and

850*b*), which in turn induces a second changing current in the second conductor 804 and a third changing current in the third conductor 805. In this fashion, signals and/or power can be coupled between a circuit comprising the first conductor 803 and other circuits comprising the second conductor 804 and the third conductor 805.

Figure 9:
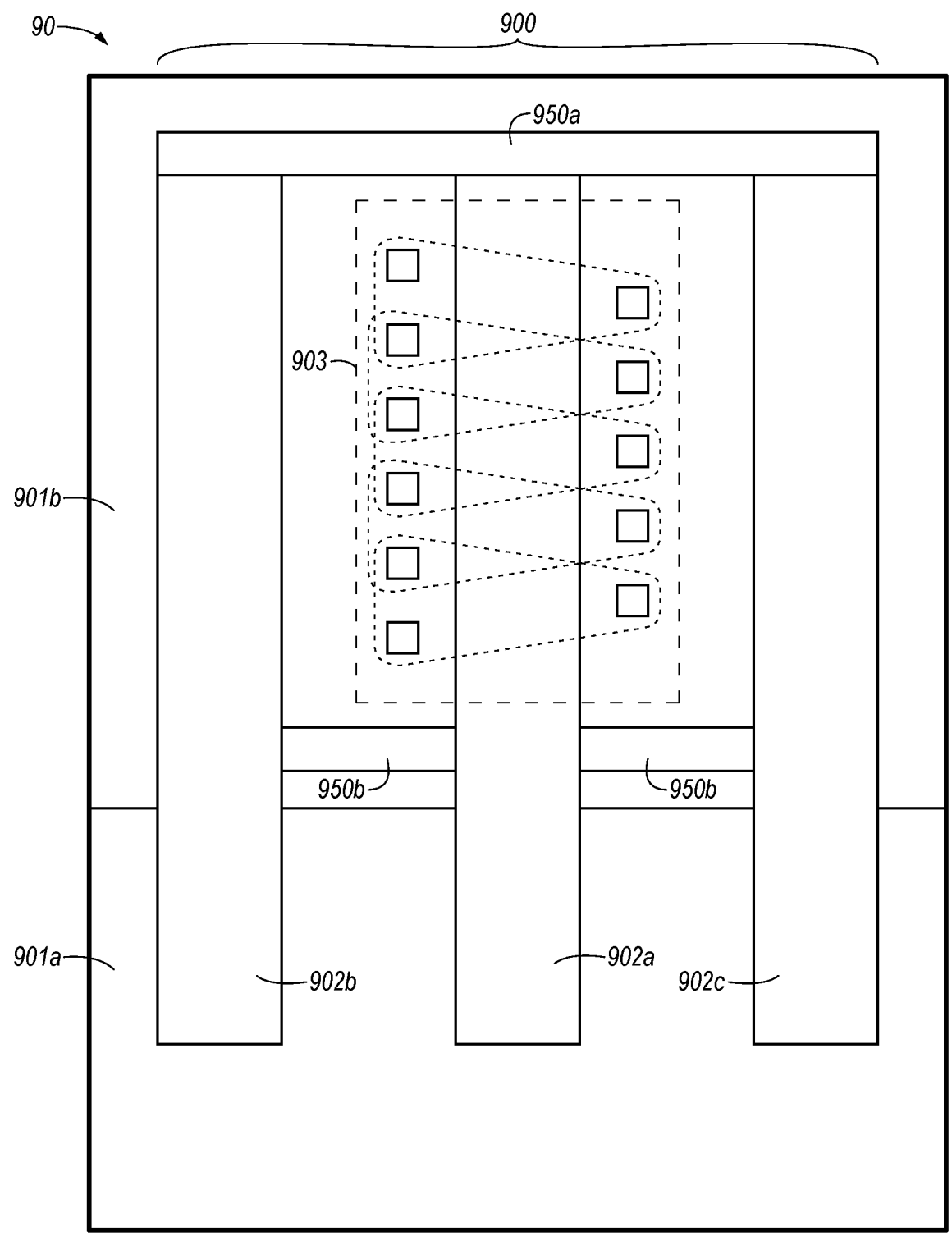
FIG. 9 is a simplified cross-sectional view of an inductor with a through-substrate via core configured in accordance with an embodiment of the present technology.

Although in the embodiments illustrated in FIGS. 5 through 8 a single additional TSV is provided to enhance the magnetic permeability of the return path for the magnetic field generated by a primary winding around a TSV, in other embodiments of the present technology multiple return path TSVs can be provided to further improve the inductance of the inductors so configured. For example, FIG. 9 is a simplified cross-sectional view of a semiconductor device 90 including an inductor 900 with a closed core configured in accordance with an embodiment of the present technology. Referring to FIG. 9, the device 90 includes a substrate material 901*a* and an insulating material 901*b*, and the inductor 900 has one portion in the substrate material 901*a* and another portion in the insulating material 901*b*. For example, the inductor 900 can include three TSVs 902*a*, 902*b* and 902*c*, each having a first portion in the substrate material 901*a* and a second portion in the insulating material 901*b*. The three TSVs 902*a*, 902*b* and 902*c* accordingly extend out of the substrate material 901*a* and into the insulating material 901*b*. The inductor 900 can further include a substantially helical conductor 903 ("conductor 903") with five turns around the first TSV 902*a*. The three TSVs 902*a*, 902*b* and 902*c* are coupled (a) above the conductor 903 by an upper coupling member 950*a*, and (b) below the conductor 903 by a lower coupling member 950*b*. In accordance with one aspect of the present technology, the three TSVs 902*a*, 902*b* and 902*c*, together with the upper and lower coupling members 950*a* and 950*b*, provide a closed path for the magnetic field generated by the conductor 903 such that the inductance of the inductor 900 is greater than it would be if only the first TSV 902*a* were provided.

Although in the example embodiment illustrated in FIG. 9 an inductor with a completely closed core (e.g., a core in which a continuous path of high magnetic permeability material passes through the middle of a winding) is illustrated, in other embodiments one or both of upper and lower coupling members could be omitted. In such an embodiment, multiple additional TSVs (e.g., in addition to the TSV around which the winding is disposed) with elevated magnetic permeability could be situated near the TSV around which the winding is disposed to provide an open core embodiment with improved inductance.

Figure 10:
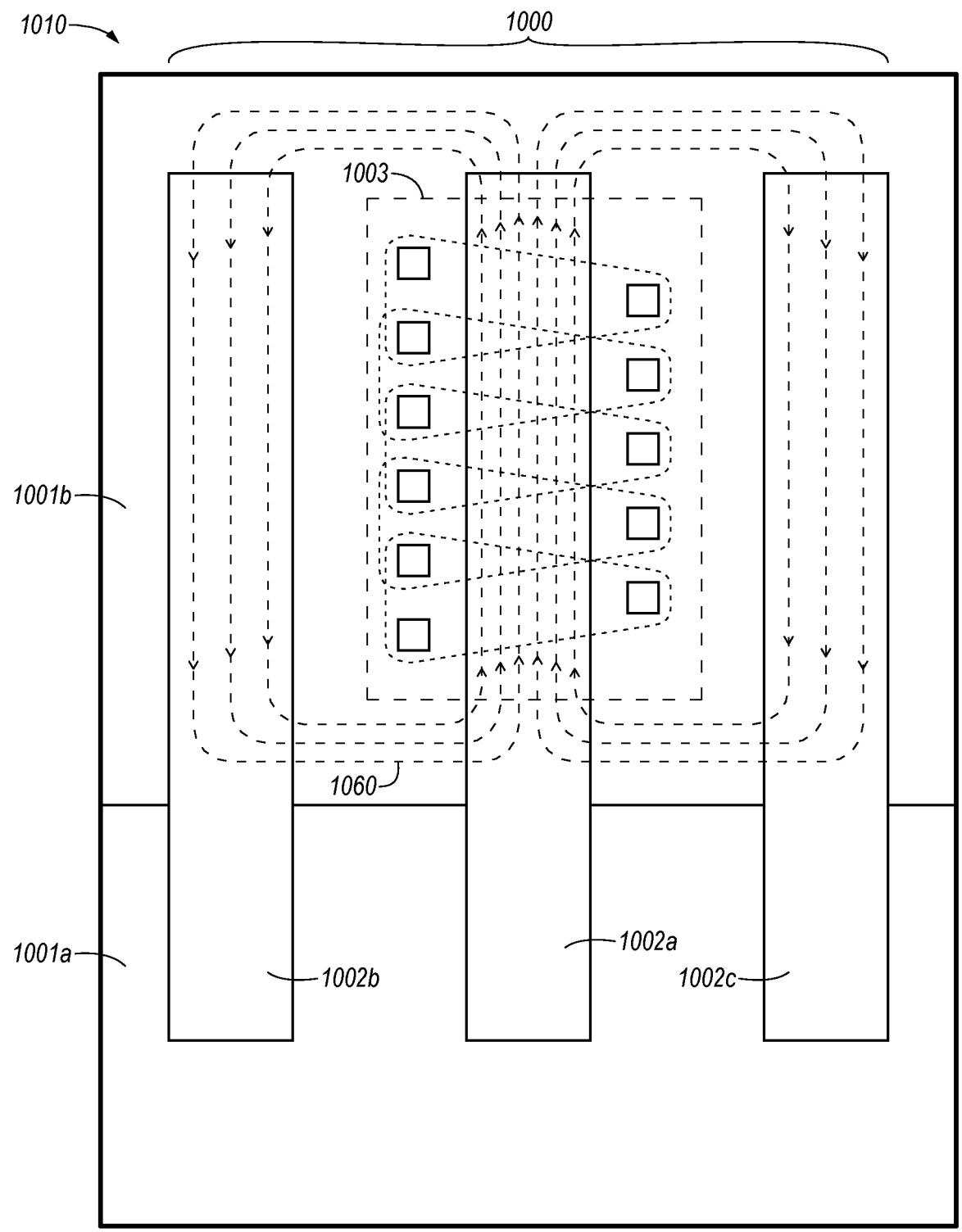
FIG. 10 is a simplified cross-sectional view of an inductor with a through-substrate via core configured in accordance with an embodiment of the present technology.

For example, FIG. 10 is a simplified cross-sectional view of a semiconductor device 1010 including an inductor 1000 with a through-substrate via core configured in accordance with an embodiment of the present technology. In this embodiment, the device 1010 includes a substrate material 1001*a* and an insulating material, and the inductor 1000 has one portion in the substrate material 1001*a* and another portion in the insulating material 1001*b*. For example, the inductor 1000 can include three TSVs 1002*a*, 1002*b* and 1002*c* that each have a first portion in the substrate material 1001*a* and a second portion in the insulating material 1001*b*. The three TSVs 1002*a*, 1002*b* and 1002*c* accordingly extend out of the substrate material 1001*a* and into the insulating material 1001*b*. The inductor 1000 can further include a substantially helical conductor 1003 ("conductor 1003") with five turns around the first TSV 1002*a*. In accordance with one aspect of the present technology, the additional TSVs 1002*b* and 1002*c* contribute to a high magnetic permeability path for the magnetic field induced by the conductor 1003 (and illustrated with magnetic field lines, such as magnetic field line 1060) such that the inductance of the inductor 1000 is greater than it would be if only the first TSV 1002*a* were provided.

Figure 11:
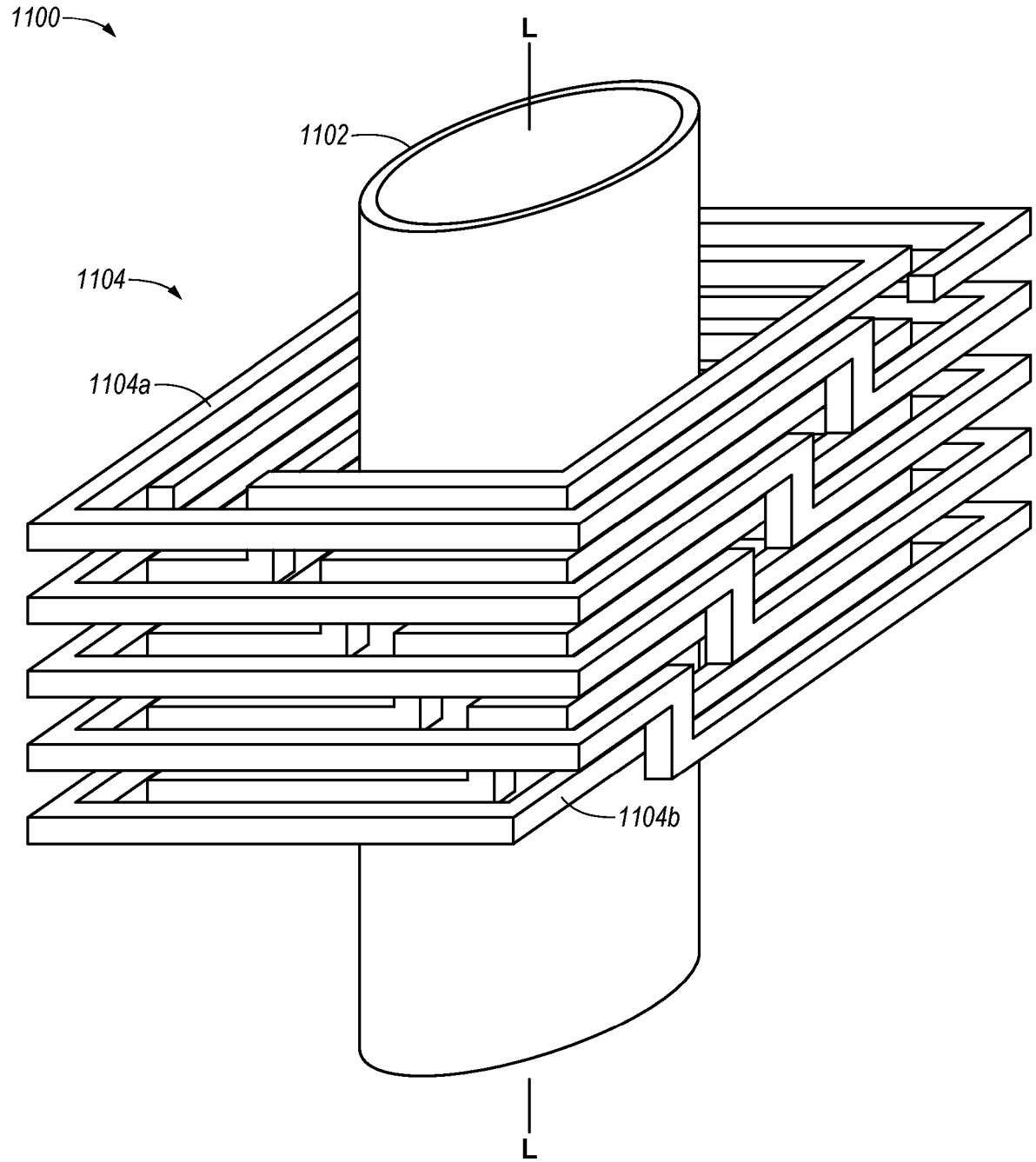
FIG. 11 is a simplified perspective view of a substantially helical conductor disposed around a through-substrate via configured in accordance with an embodiment of the present technology.

Although in the foregoing examples set forth in FIGS. 1 to 10 each substantially helical conductor has been illustrated as having a single turn about a TSV at a given distance from the surface of the substrate, in other embodiments a substantially helical conductor can have more than one turn about a TSV at the same distance from the substrate surface (e.g., multiple turns arrange coaxially at each level). For example, FIG. 11 is a simplified perspective view of a substantially helical conductor 1104 ("conductor 1104") disposed around a through-substrate via 1102 configured in accordance with an embodiment of the present technology. As can be seen with reference to FIG. 11, the conductor 1104 includes a first substantially helical conductor 1104*a* ("conductor 1104*a*") disposed around the TSV 1102, which is connected to a second coaxially-aligned substantially helical conductor 1104*b* ("conductor 1104*b*"), such that a single conductive path winds downward around TSV 1102 at a first average radial distance, and winds back upward around TSV 1102 at a second average radial distance. Accordingly, the conductor 1104 includes two turns about the TSV 1102 (e.g., the topmost turn of conductor 1104*a* and the topmost turn of conductor 1104*b*) at the same position along the longitudinal dimension "L" of the TSV 1102. In another embodiment, a substantially helical conductor could make two turns about a TSV at a first level (e.g., spiraling outward), two turns about a TSV at a second level (e.g., spiraling inward), and so on in a similar fashion for as many turns as were desired.

Figure 12A:
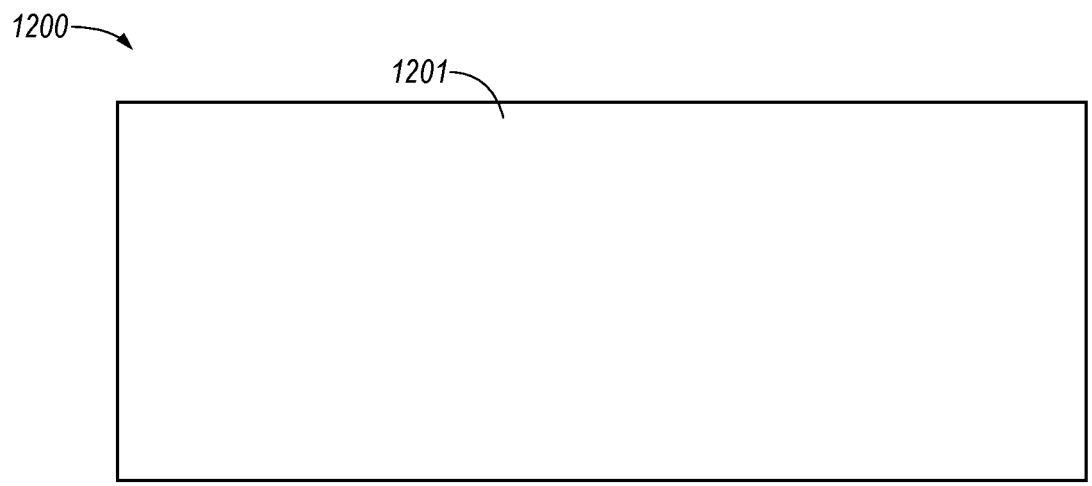
FIGS. 12A through 12D are simplified cross-sectional views of an inductor with a through-substrate via core at various stages of a manufacturing process in accordance with an embodiment of the present technology.
Figure 12B:
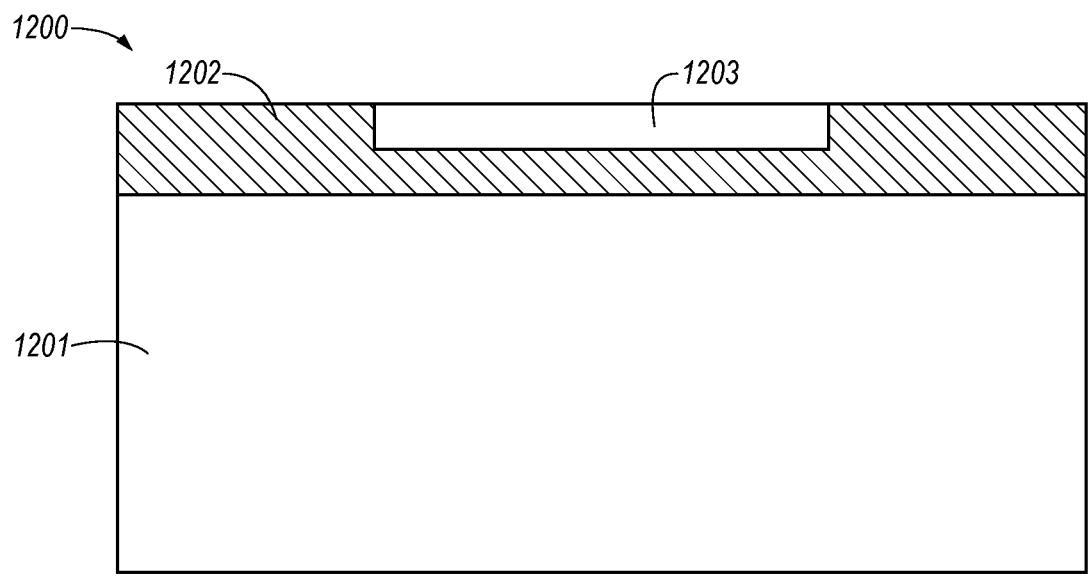

FIGS. 12A-12F are simplified views of a device 1200 having an inductor with a through-substrate via core in various stages of a manufacturing process in accordance with an embodiment of the present technology. In FIG. 12A, a substrate 1201 is provided in anticipation of further processing steps. The substrate 1201 may be any one of a number of substrate materials, including silicon, glass, gallium arsenide, gallium nitride, an organic laminate, or the like. In FIG. 12B, a first turn 1203 of a substantially helical conductor has been disposed in a layer of the insulating material 1202 over the substrate 1201. The insulating material 1202 can be any one of a number of insulating materials which are suitable for semiconductor processing, including silicon oxide, silicon nitride, polyimide, or the like. The first turn 1203 can be any one of a number of conducting materials which are suitable for semiconductor processing, including copper, gold, tungsten, alloys thereof, or the like.

Figure 12C:
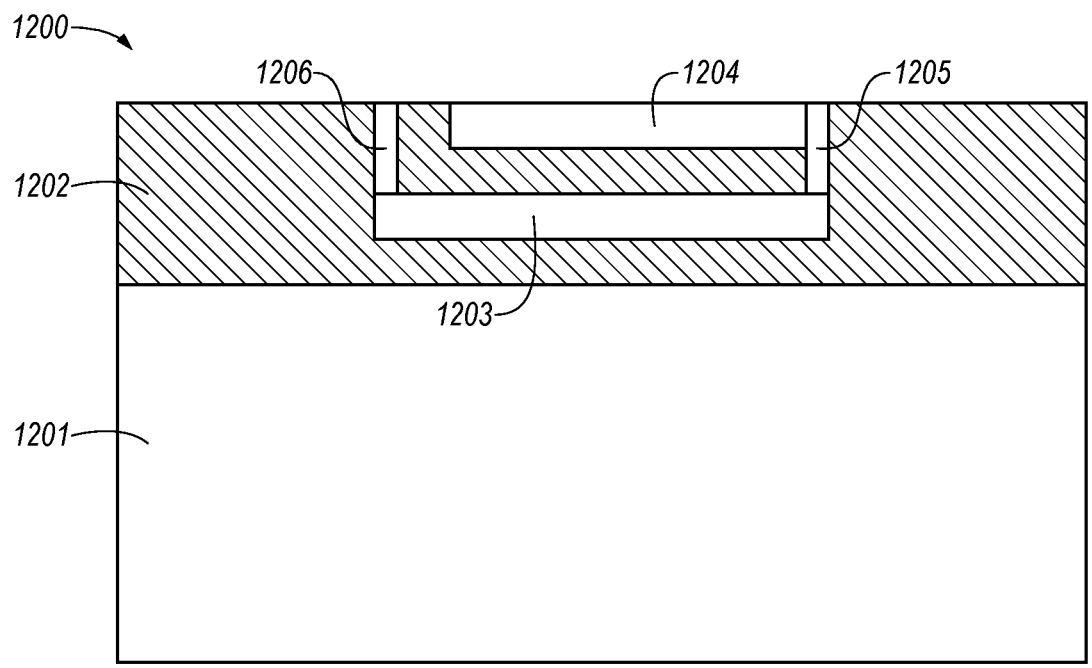
Figure 12D:
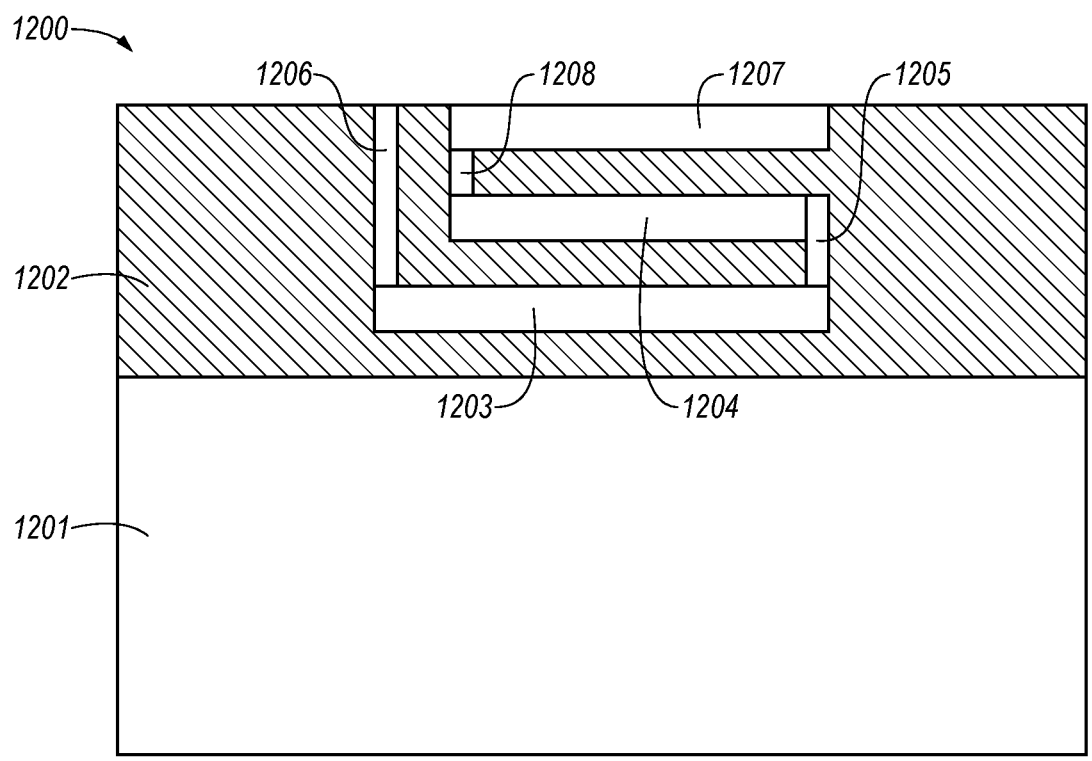

In FIG. 12C, a second turn 1204 of the substantially helical conductor has been disposed in the now thicker layer of the insulating material 1202, and spaced from the first turn 1203 by a layer of the insulating material 1202. The second turn 1204 is electrically connected to the first turn 1203 by a first via 1205. A second via 1206 has also been provided to route an end of the first turn 1203 to an eventual higher layer of the device 1200. In FIG. 12D, a third turn 1207 of the substantially helical conductor has been disposed in the now thicker layer of the insulating material 1202, and spaced from the second turn 1204 by a layer of the insulating material 1202. The third turn 1207 is electrically connected to the second turn 1204 by a third via 1208. The second via 1206 has been further extended to continue routing an end of the first turn 1203 to an eventual higher layer of the device 1200.

Figure 12E:
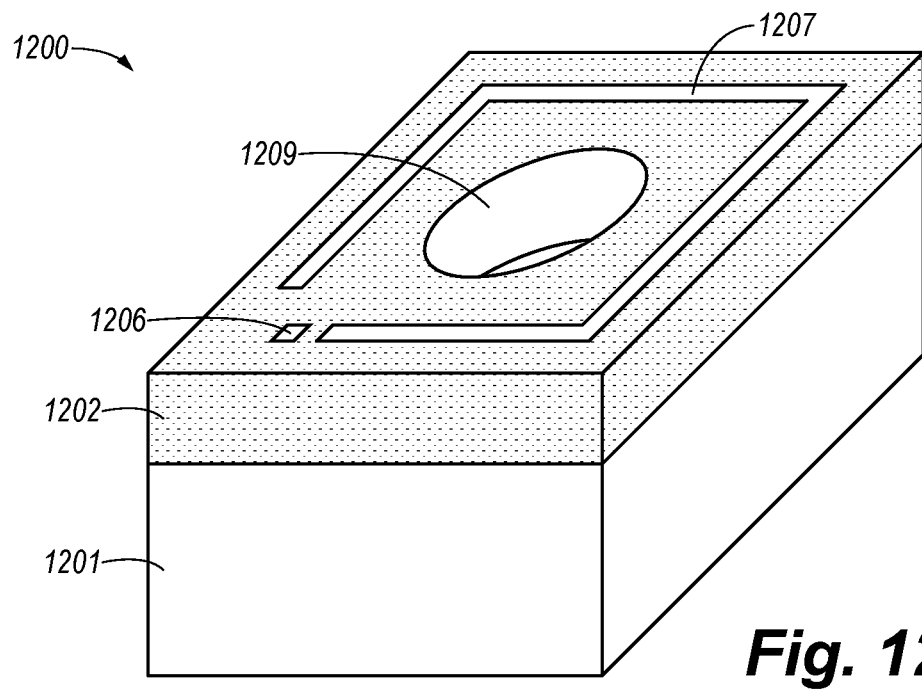
FIGS. 12E and 12F are simplified perspective views of an inductor with a through-substrate via core at various stages of a manufacturing process in accordance with an embodiment of the present technology.
Figure 12F:
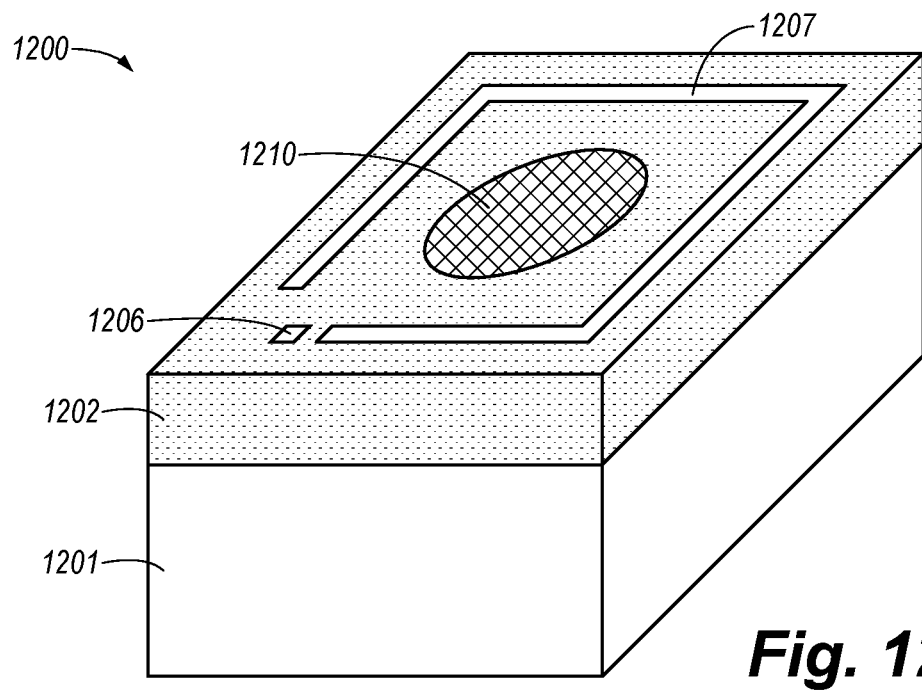

Turning to FIG. 12E, the device 1200 is illustrated in a simplified perspective view after an opening 1209 has been etched through the insulating material 1202 and into the substrate 1201. The opening 1209 is etched substantially coaxially with the turns 1203, 1204 and 1207 of the substantially helical conductor using any one of a number of etching operations capable of providing a substantially vertical opening with a high aspect ratio. For example, deep reactive ion etching, laser drilling, or the like can be used to form the opening 1209. In FIG. 12F, a TSV 1210 has been disposed in the opening 1209. The TSV 1210 can include a magnetic material (e.g., a material with a higher magnetic permeability than the substrate 1201 and/or the insulating material 1202) to increase the magnetic field in the TSV 1210 when current is flowing through the substantially helical conductor. The magnetic material can be ferromagnetic, ferrimagnetic, or a combination thereof. The TSV 1210 can include more than one material, either in a bulk material of a single composition, or in discrete regions of different materials (e.g., coaxial laminate layers). For example, the TSV 1210 can include nickel, iron, cobalt, niobium, or an alloy thereof. Laminated layers of magnetic and non-magnetic material can help to reduce eddy current losses in the TSV 1210. The TSV 1210 can be provided in a single metallization step filling in the opening 1209, or in multiple steps of laminating layers (e.g., multiple magnetic layers separated by non-magnetic layers). In one embodiment, to provide a TSV with a multiple layer structure, a mixture of conformal and bottom-up fill plating operations can be utilized (e.g., a conformal plating step to partially fill and narrow the etched opening with a first material, and a subsequent bottom-up plating step to completely fill the narrowed opening with a second material).

Figure 13:
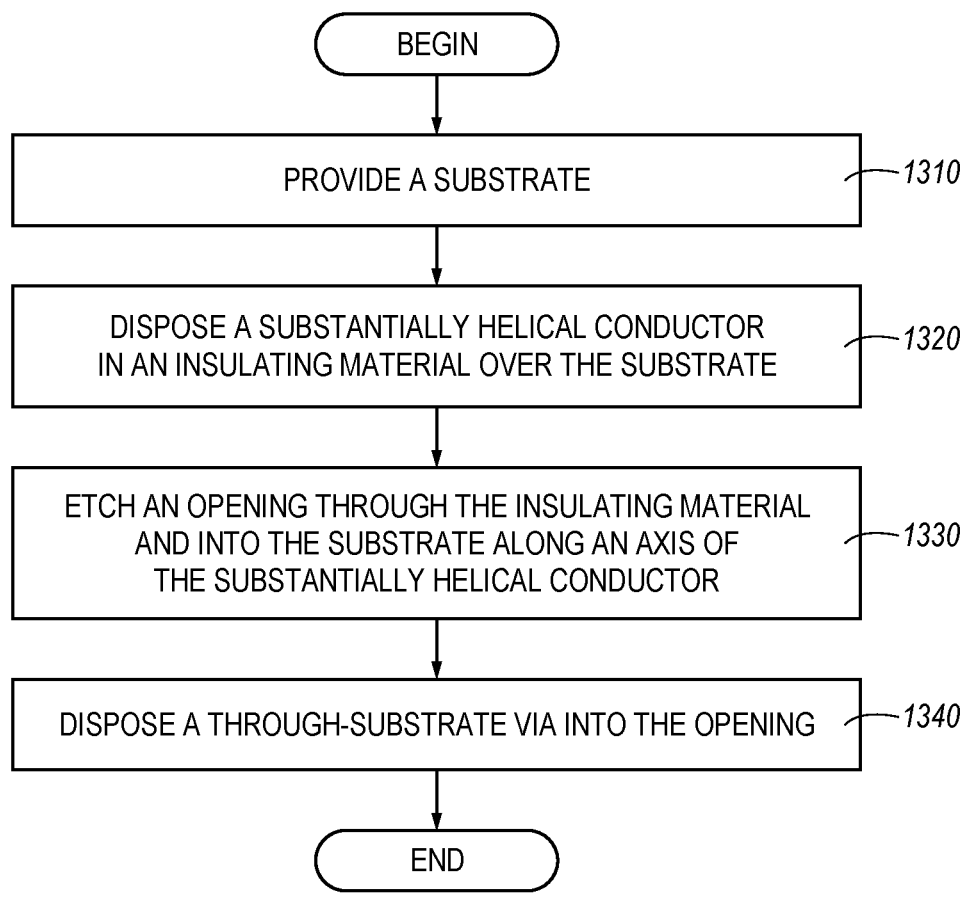
FIG. 13 is a flow chart illustrating a method of manufacturing an inductor with a through-substrate via core in accordance with an embodiment of the present technology.

FIG. 13 is a flow chart illustrating a method of manufacturing an inductor with a through-substrate via core in accordance with an embodiment of the present technology. The method begins in step 1310, in which a substrate is provided. In step 1320, a substantially helical conductor is disposed in an insulating material over the substrate. In step 1330, an opening is etched through the insulating material and into the substrate along an axis of the substantially helical conductor. In step 1340, a TSV is disposed into the opening.

From the foregoing, it will be appreciated that specific embodiments of the invention have been described herein for purposes of illustration, but that various modifications may be made without deviating from the scope of the invention. Accordingly, the invention is not limited except as by the appended claims.

I claim:
1. A semiconductor device, comprising:
a semiconductor substrate;
a through-substrate via (TSV) surrounded by and extending into the semiconductor substrate;
a first substantially helical conductor disposed around the TSV; and
a second substantially helical conductor disposed around the TSV.
2. The semiconductor device of claim 1, wherein the first substantially helical conductor is configured to induce a change in a magnetic field in the TSV in response to a first changing current in the first substantially helical conductor, and wherein the second substantially helical conductor is configured such that a second changing current is induced in the second substantially helical conductor in response to the change in the magnetic field.
3. The semiconductor device of claim 2, further comprising:
a third substantially helical conductor disposed around the TSV,
wherein the third substantially helical conductor is configured to have a third changing current induced therein in response to the change in the magnetic field.
4. The semiconductor device of claim 1, wherein the TSV comprises a ferromagnetic or a ferrimagnetic material.
5. The semiconductor device of claim 1, wherein the TSV is separated from the first substantially helical conductor and second substantially helical conductor by an insulating material.
6. The semiconductor device of claim 1, wherein the first substantially helical conductor comprises a first different number of turns around the TSV different from a second number of turns of the second substantially helical conductor around the TSV.
7. The semiconductor device of claim 1, wherein the first substantially helical conductor and the second substantially helical conductors comprise a same number of turns around the TSV.
8. The semiconductor device of claim 1, wherein one of the first substantially helical conductor and the second substantially helical conductor comprises more than one turn around the TSV.
9. The semiconductor device of claim 1, wherein the first substantially helical conductor and the second substantially helical conductors are coaxially aligned with the TSV.
10. The semiconductor device of claim 1, wherein the first substantially helical conductor and the second substantially helical conductor are isolated from each other and from the TSV.
11. The semiconductor device of claim 1, wherein the first substantially helical conductor is spaced from the second substantially helical conductor along a primary axis of the TSV.
12. The semiconductor device of claim 1, wherein the first substantially helical conductor has an average radial distance from the TSV different than an average radial distance of the second substantially helical conductor from the TSV.
13. The semiconductor device of claim 1, wherein the first substantially helical conductor is disposed radially inward of the second substantially helical conductor.
14. The semiconductor device of claim 1, wherein the TSV is a first TSV, and further comprising a second TSV and a third substantially helical conductor disposed around the second TSV.
15. The semiconductor device of claim 14, wherein the first TSV is coupled to the second TSV by an upper coupling member above the first substantially helical conductor, the second substantially helical conductor, and the third substantially helical conductors, and by a lower coupling member below the first first substantially helical conductor, the second substantially helical conductor, and the third substantially helical conductors, such that the first TSV and the second TSVs and the upper and lower coupling members form a closed path for a magnetic field.
16. A semiconductor device, comprising:
a semiconductor substrate;
at least one through-substrate via (TSV) surrounded by and extending into the semiconductor substrate;
a first substantially helical conductor disposed around the at least one TSV; and
a second substantially helical conductor disposed around the at least one TSV.
17. The semiconductor device of claim 16, wherein the at least one TSV comprises a first TSV and a second TSV, wherein the first substantially helical conductor is disposed around the first TSV, and wherein the second substantially helical conductor is disposed around the second TSV.

18. The semiconductor device of claim 16, wherein the at least one TSV comprises a single TSV, and wherein the first substantially helical conductor is vertically spaced from the second substantially helical conductor along the single TSV.

19. A semiconductor device, comprising:
- a semiconductor substrate; and
- at least one through-substrate via (TSV) surrounded by and extending into the semiconductor substrate,
- a first substantially helical conductor disposed around the at least one TSV, and
- a second substantially helical conductor disposed around the at least one TSV,
- wherein the first substantially helical conductor comprises a first number of turns around the TSV different from a second number of turns of the second substantially helical conductor around the TSV, and
- wherein the semiconductor device is configured to operate as a transformer.

* * * * *